US007485481B2

(12) United States Patent
Kim et al.

(10) Patent No.: US 7,485,481 B2
(45) Date of Patent: Feb. 3, 2009

(54) ORGANIC ELECTROLUMINESCENT DEVICE COMPRISING ELECTRON SHOWER TREATED HOLE INJECTION LAYER AND METHOD FOR PREPARING THE SAME

(75) Inventors: Mu-Gyeom Kim, Hwaseong-si (KR); Jong-Jin Park, Guri-si (KR); Sang-Yeol Kim, Gwacheon-si (KR); Tae-Woo Lee, Seoul (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 425 days.

(21) Appl. No.: 11/302,448

(22) Filed: Dec. 14, 2005

(65) Prior Publication Data

US 2006/0152152 A1 Jul. 13, 2006

(30) Foreign Application Priority Data

Jan. 8, 2005 (KR) ..................... 10-2005-0001949

(51) Int. Cl.
*H01L 21/00* (2006.01)

(52) U.S. Cl. .................. 438/29; 257/98; 257/E21.024; 438/780; 438/795

(58) Field of Classification Search .................. 257/98, 257/E21.024; 438/29, 780, 795
See application file for complete search history.

(56) References Cited

U.S. PATENT DOCUMENTS 6,396,209 B1 * 5/2002 Kido et al. .................. 313/504
2004/0137652 A1 * 7/2004 Ishii ............................ 438/22

* cited by examiner

*Primary Examiner*—Asok K Sarkar
(74) *Attorney, Agent, or Firm*—Robert E. Bushnell, Esq.

(57) ABSTRACT

An organic electroluminescent device has an anode formed on a substrate, a hole injection layer formed on the anode, wherein the hole injection layer is subjected with an electron shower treatment, an emitting layer formed on the hole injection layer, and a cathode formed on the emitting layer. With the electron shower treatment, impurities from the hole injection layer can be removed, and electrical surface resistance of the hole injection layer cab be increased so that performance and life characteristics of the organic electroluminescent device are improved.

19 Claims, 3 Drawing Sheets

ORGANIC ELECTROLUMINESCENT DEVICE COMPRISING ELECTRON SHOWER TREATED HOLE INJECTION LAYER AND METHOD FOR PREPARING THE SAME

CROSS-REFERENCE TO RELATED PATENT APPLICATION AND CLAIM OR PRIORITY

This application claims the benefit of Korean Patent Application No. 10-2005-0001949, filed on Jan. 8, 2005, in the Korean Intellectual Property Office, the disclosure of which is incorporated herein in its entirety by reference.

BACKGROUND OF THE INVENTION

1. Field of the Invention

The present invention relates to an organic electroluminescent device comprising an electron shower treated hole injection layer and a method for preparing the same, and more particularly, to an organic electroluminescent device having improved performance and service life characteristics and increased electrical surface resistance of a hole injection layer by performing an electron shower treatment to remove impurities from the hole injection layer, and a method for preparing the organic electroluminescent device.

2. Description of the Related Art

Electroluminescent devices (EL devices) are self emission type display devices based on the principle that electrons and holes are combined to emit light when a current is applied to a fluorescent or phosphorescent organic layer. Because of many advantages such as a thin and lightweight configuration, simple components, a simplified manufacturing process, realization of a high definition and high color purity, low power consumption, and realization of a complete moving picture and full color display, organic EL devices have attracted much attention and have been actively researched.

To improve luminous efficiency and to reduce a driving voltage, the organic EL device generally comprises multiple organic layers including a hole injection layer, an electron transport layer, a hole transport layer, an emitting layer and the like, rather than using a single emitting layer as an organic layer. The multiple organic layers are basically divided into hole-related layers, electron-related layers, and an emitting layer. FIG. 1 is a cross-sectional view of a general organic EL device (e.g., a system employing a small molecular weight emitting layer. Referring to FIG. 1, a stacked structure is illustrated, in which a negative electrode or anode 12 is stacked on a substrate 11, a hole injection layer (HIL) 13 and a hole transport layer (HTL) 14 as hole-related layers are stacked thereon, an electron emitting layer (EML) 15 is stacked thereon, an electron transport layer (ETL) 16 and an electron injection layer (EIL) 17 as electron-related layers are stacked thereon, and a positive electrode or cathode 18 is finally stacked thereon.

In the organic EL device having the stacked structure, the hole injection layer 13 is formed for purposes of reducing a voltage applied, enhancing an emission efficiency and increasing a service life of the device. The hole injection layer 13 is made of copper phthalocyanine, starburst-type amines, e.g., TCTA, or m-TDATA, or poly(3,4-ethylenedioxythiophene) (PEDOT).

However, when the hole injection materials are used for a hole injection layer without a separate treatment, several problems, including deterioration in performance, reduction in electrical surface resistance, and so on, may be undesirably presented due to surface impurities.

SUMMARY OF THE INVENTION

The present invention provides an organic electroluminescent device having improved performance and service life characteristics and improved electrical surface resistance of a hole injection layer by performing an electron shower treatment to remove impurities from the hole injection layer, and a method for preparing the organic electroluminescent device.

According to an aspect of the present invention, there is provided an organic electroluminescent device including an anode formed on a substrate; a hole injection layer formed on the anode, wherein the hole injection layer is subjected with an electron shower treatment; an emitting layer formed on the hole injection layer; and a cathode formed on the emitting layer.

According to another aspect of the present invention, there is provided a method for preparing an organic electroluminescent device including forming an anode on a substrate; forming a hole injection layer on the anode; performing an electron shower treatment on the hole injection layer; forming an emitting layer on the hole injection layer; and forming a cathode on the emitting layer.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described in more detail.

The present invention is directed to an organic EL device and a method of preparing the same. Specifically, the present invention relates to an organic EL device having improved performance and service life by performing an electron shower treatment on a hole injection layer, which functions to facilitate hole injection into an emitting layer, in the course of manufacturing the organic EL device to remove impurities from the hole injection layer. The present invention also relates to a method of preparing the organic EL device.

In an aspect of the present invention, there is provided an organic electroluminescent device including a first electrode formed on a substrate, an electron shower treated hole injection layer formed on the first electrode, an emitting layer formed on the hole injection layer, and a second electrode formed on the emitting layer.

In the present invention, a modified hole injection layer is formed by performing an electron shower treatment on the hole injection layer to facilitate removal of pre-degradation in the surface of the hole injection layer or removal of unstable impurities and to minimize a deterioration in the performance due to unstable ions such as sulfur ions and halogen impurities.

In order to obtain a low current density, the electron shower treatment is preferably carried out by a side electron shower method rather than a direct electron shower method.

Figure 1:
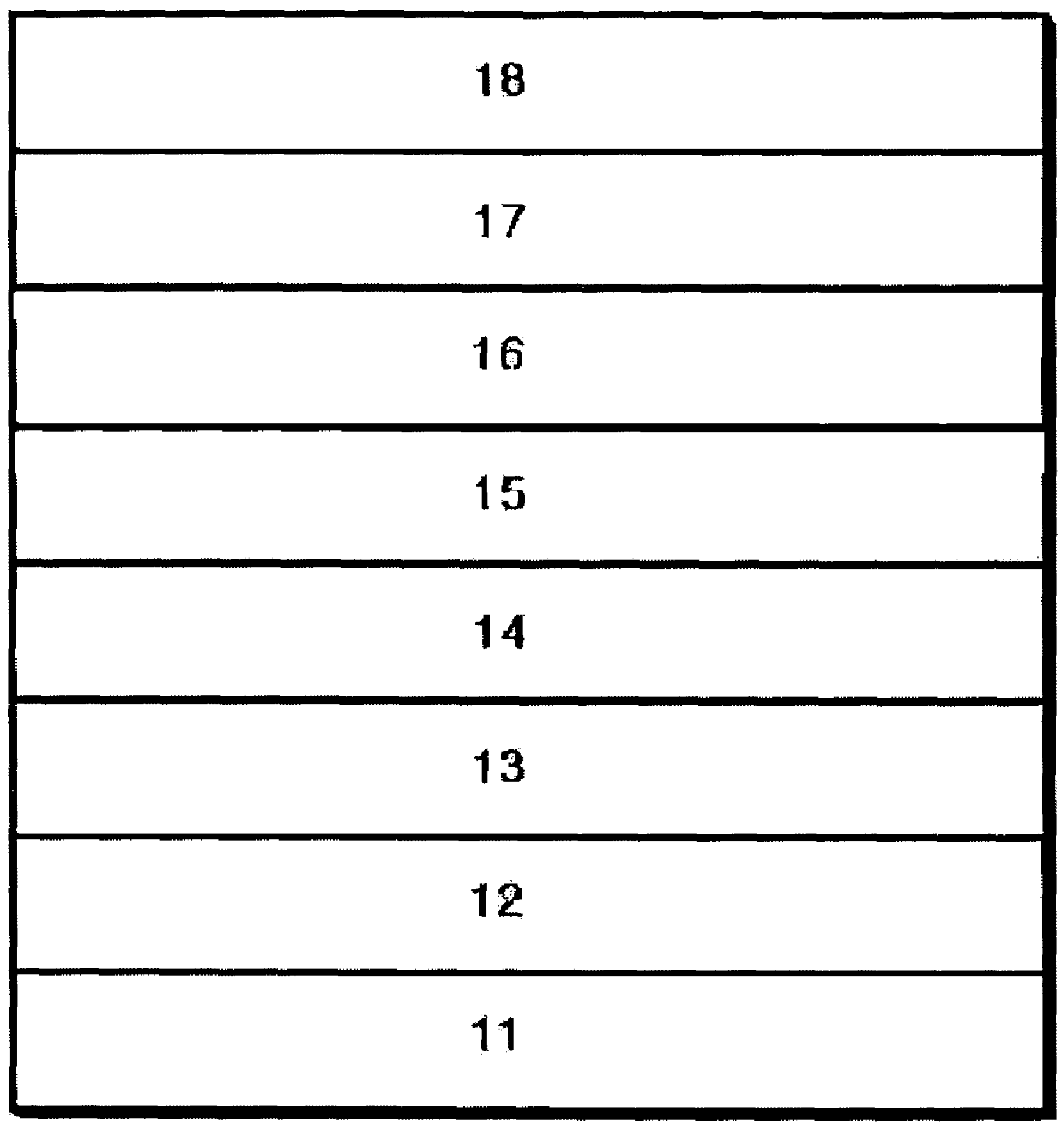
FIG. 1 is a cross-sectional view of a conventional organic EL device.
Figure 2:
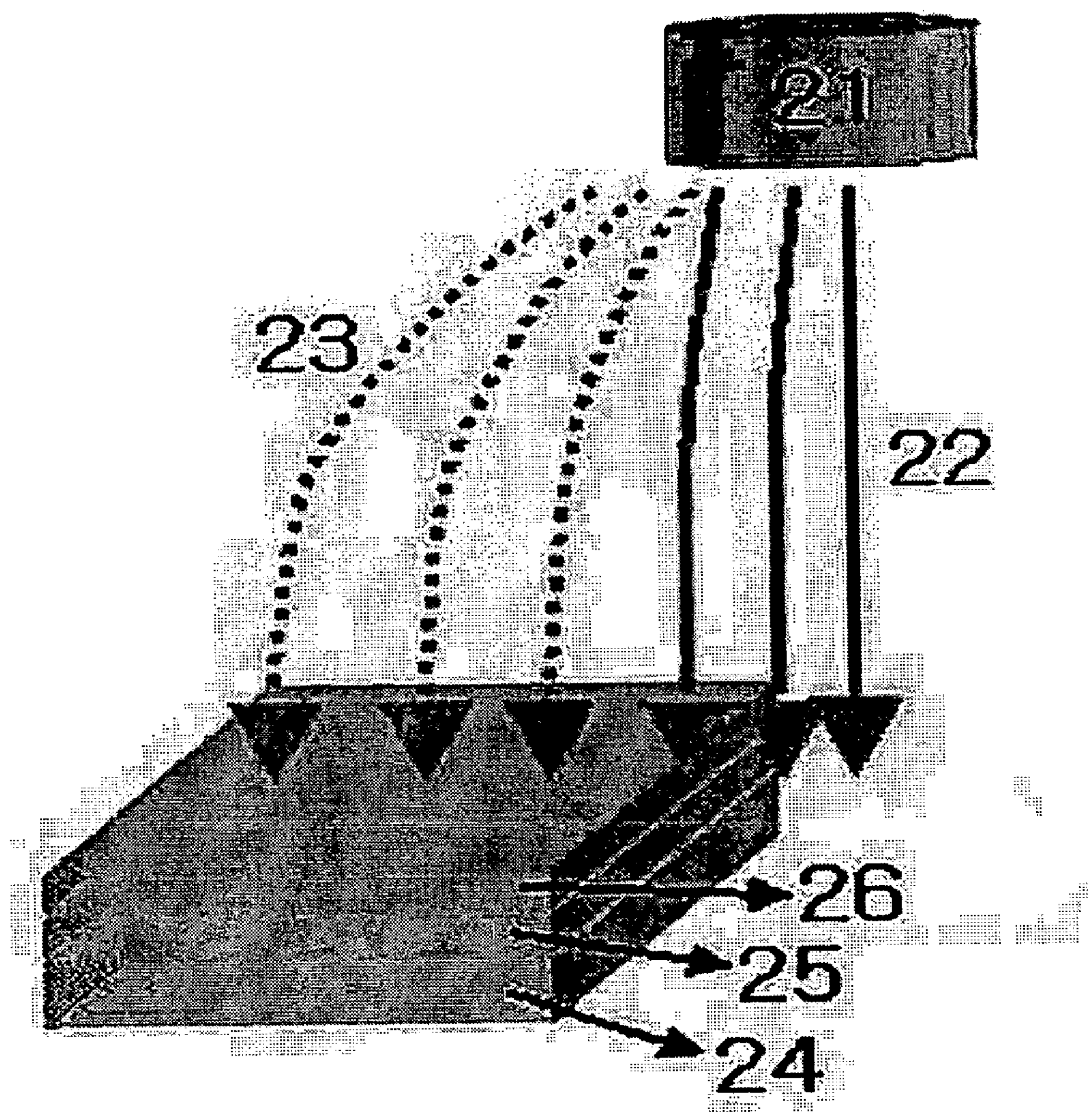
FIG. 2 is a schematic diagram for comparing a direct electron shower treatment with a side electron shower treatment employed in the present invention.

FIG. 2 is a schematic diagram for comparing a direct electron shower treatment with a side electron shower treatment employed in the present invention. As shown in FIG. 2, according to the side electron shower treatment employed in the present invention, a hole injection layer to be treated is not positioned on an electron emission path 22 from an electron emission source 21. Rather, an object to be treated, that is, a stacked structure in which a hole injection layer 25 is stacked on a substrate 24, is positioned at a location 23 deviating from the electron emission path 22. As a result, the hole injection layer 25 is converted to a modified hole injection layer 26. Use of such a side shower treatment enables an interfacial treatment effect.

In more detail, according to the side electron shower treatment employed in the present invention, the object to be treated should be positioned at a location deviating from an irradiation area based on a direct shower method with the proviso that the location falls within the diameter range as proposed by electron gun manufacturers, and a distance from an electron gun suitably ranges from 100 mm to 200 mm. The location of the object to be treated can be empirically optimized in consideration of a change in characteristics due to surface treatment and a processing time. For example, the longer the distance between the electron gun and the object, the longer the processing time. However, the shorter distance between the electron gun and the object makes it more difficult to optimally adjust surface treatment effects. Here, the expected interfacial treatment effects includes suppressing migration of impurities, which are generated when the device is electrically driven, by stabilizing electrically unstable portions of a conductive polymer surface and increasing interfacial resistance.

The electron shower treatment is preferably carried out with an electron energy of 10 eV to 100 eV. If the electron energy is less than 10 eV, the energy based on the side shower treatment is not enough to perform surface treatment, which is not desirable. If the electron energy is greater than 100 eV, the conductive polymer surface is overly treated.

In addition, the processing time of the electron shower treatment is preferably adjusted such that surface resistance of the hole injection layer is increased by not greater than 10% initial surface resistance. If the processing time of the electron shower treatment is too short, the interfacial treatment is not sufficiently performed. If the processing time of the electron shower treatment is too long, the interfacial resistance of the hole injection layer increases so that the hole injection layer cannot properly function as a conductive polymer.

Further, to remove remaining materials coming off from the surface of the hole injection layer, the electron shower treatment may include a blowing treatment carried out in a nitrogen atmosphere. If the materials coming off from the surface of the hole injection layer remain on the surface of the hole injection layer, several problems such as a leakage current or instability of a device, may be presented.

The electron shower treatment may also include heating under vacuum or in a nitrogen atmosphere. The heating treatment provides a surface stabilizing effect. Here, the heating treatment is carried out under conditions that a heating temperature is not higher than the glass-transition temperature, Tg, of the conductive polymer of a hole injection layer, and power (temperature×time) is in the range in which a polymer is not thermally damaged.

Various layers stacked in the organic EL device according to the present invention will now be described in more detail.

The organic EL device according to the present invention can be categorized as a system employing a polymer emitting layer or a system employing a small molecule emitting layer.

In the case of the system employing a polymer emitting layer, the organic EL device according to the present invention includes a first electrode (an anode) formed on a substrate, an electron shower treated hole injection layer formed on the anode, an emitting layer formed on the hole injection layer, and a cathode formed on an electron transport layer.

In the organic EL device according to the present invention, the substrate is a substrate that is generally used for an organic EL device, and is preferably an organic substrate or a transparent plastic substrate having superior transparency, surface smoothness, manageability and water repellency.

In a case where the organic EL device according to the present invention is of a front emission type, the anode formed on the substrate employs a metal layer as a reflective layer. In a case where the organic EL device according to the present invention is of a rear emission type, the anode is preferably made of a transparent, highly conductive material, such as indium tin oxide (ITO), indium zinc oxide (IZO), stannic oxide ($SnO_2$), zinc oxide (ZnO), or a mixture thereof.

The hole injection layer may be formed of a material that is generally used in the manufacture of a hole injection layer. Useful examples of the hole injection layer include, but not limited to, copper phthalocyanine, starburst-type amines, e.g., TCTA or m-MTDATA, poly(3,4-ethylenedioxythiophene) (PEDOT), and a mixture thereof.

The hole injection layer preferably has a thickness in the range of 300 to 1,000 Å. If the thickness of the hole injection layer is less than 300 Å, hole injection capability undesirably deteriorates. If the thickness of the hole injection layer is greater than 1,000 Å, the driving voltage undesirably rises.

Optionally, a hole transport layer (HTL) may be stacked on the hole injection layer. Useful examples of the hole transport layer include, but not limited to, poly(9,9-dioctylfluorene-co-N-(4-butylphenyl)diphenylamine (TFB), and poly(9,9-dioctylfluorene-co-bis-N,N'-(4-butylphenyl)-bis-N,N'-phenyl-1,4-phenylenediamine (PFB), 9,9-dioctylfluorene-co-bis-N,N-(4-butylphenyl)-bis-N,N-phenylbenzidine (BFE), and a mixture thereof.

The hole transport layer preferably has a thickness in the range of 100 to 300 Å. If the thickness of the hole transport layer is less than 100 Å, hole transporting capability undesirably deteriorates. If the thickness of the hole transport layer is greater than 300 Å, the driving voltage undesirably rises.

In the case of the system employing a polymeric emitting layer, the organic EL device according to the present invention may employ a fluorescent or phosphorescent material as an emitting layer.

In addition, an electron injection layer (EIL) may be optionally stacked on the emitting layer. Useful examples of the electron injection layer include, but not limited to, LiF, Li, Ba, $BaF_2$/Ca, and the like.

Finally, a metal for a cathode as a second electrode is stacked on the emitting layer (without the electron injection layer) or the electron injection layer. The cathode is made of a metal such as lithium (Li), magnesium (Mg), aluminum (Al), aluminum-lithium (Al—Li), calcium (Ca), magnesium-indium (Mg—In), magnesium-silver (Mg—Ag), or the like.

In the case of the system employing a small molecule emitting layer, the organic EL device according to the present invention includes an anode formed on a substrate, an electron shower treated hole injection layer formed on the anode, a hole transport layer formed on the hole injection layer, an emitting layer formed on the hole transport layer, an electron injection layer formed on the emitting layer, an electron transport layer formed on the electron injection layer, and a cathode formed on the electron transport layer.

The same substrate, anode and hole injection layer can be used as those of the system employing a polymeric emitting layer.

In the system employing a small molecule emitting layer, the hole injection layer preferably has a thickness in the range of 50 to 1500 Å. If the thickness of the hole injection layer is less than 50 Å, hole injection capability deteriorates. If the thickness of the hole injection layer is greater than 1500 Å, the driving voltage undesirably rises.

In addition, in the system employing a small molecule emitting layer, useful examples of the hole transport layer include, but not limited to, N,N'-bis(3-methylphenyl)-N,N'-diphenyl-[1,1-biphenyl]-4,4'-diamine(TPD), N,N'-di(naphthalene-1-yl)-N,N'-diphenyl benzidine, IDE 320 (from Idemitz, Inc), and a mixture thereof.

The hole transport layer also preferably has a thickness in the range of 50 to 1500 Å. If the thickness of the hole transport layer is less than 50 Å, hole transporting capability deteriorates. If the thickness of the hole transport layer is greater than 1500 Å, the driving voltage undesirably rises. In the system employing a small molecule emitting layer, red-, green- and blue-emitting materials are patterned on R, G and B areas of pixel areas on the hole injection layer and the hole transport layer, thereby forming an emitting layer (EML). At least two kinds of mixed host materials can be used as the emitting materials.

The emitting layer preferably has a thickness in the range of 100 to 800 Å, more preferably in the range of 300 to 500 Å for small molecule and 700 to 800 for polymer. If the thickness of the emitting layer is less than 100 Å, the efficiency and life characteristics deteriorate. If the thickness of the emitting layer is greater than 800 Å, the driving voltage undesirably rises.

Next, in the system employing a small molecule emitting layer, an electron transport layer (ETL) is formed on the emitting layer. Materials that are generally used in the manufacture of an electron transport layer can be used as the electron transport layer material, for example, $Alq_3$. Meanwhile, the electron transport layer preferably has a thickness in the range of 50 to 600 Å. If electron transport layer is less than 50 Å, a life characteristic undesirably deteriorates. If the thickness of the electron transport layer is greater than 600 Å, the driving voltage undesirably rises.

An electron injection layer (EIL) may be selectively stacked on the electron transport layer. Useful examples of the electron injection layer material include, but not limited to, LiF, NaCl, CsF, $Li_2O$, BaO, Liq, and the like. The electron injection layer preferably has a thickness in the range of 1 to 100 Å. If the thickness of the electron injection layer is less than 1 Å, the electron injection layer cannot properly function as an electron injection layer, increasing the driving voltage. If the thickness of the electron injection layer is greater than 100 Å, the electron injection layer serves as an insulating layer, undesirably increasing the driving voltage.

Finally, a metal for a cathode as a second electrode is stacked on the electron transport layer. The cathode is made of a metal such as lithium (Li), magnesium (Mg), aluminum (Al), aluminum-lithium (Al—Li), calcium (Ca), magnesium-indium (Mg—In), magnesium-silver (Mg—Ag), or the like.

In another aspect of the present invention, there is provided a method for preparing an organic electroluminescent device including forming an anode on a substrate, forming a hole injection layer on the anode, performing an electron shower treatment on the hole injection layer, forming an emitting layer on the hole injection layer, and forming a cathode on the emitting layer.

In the method for preparing an organic EL device, a material for an anode as a first electrode is first deposited on a substrate. An insulating layer as a pixel defining layer may be formed on the anode.

Then, an organic layer as a hole injection layer is stacked over the entire surface of the substrate. The hole injection layer is stacked over the substrate using a deposition method that is generally used in the art, for example, vacuum thermal evaporation or spin coating.

The method for preparing an organic EL device include performing an electron shower treatment on the hole injection layer.

As described above, the electron shower treatment is preferably carried out by a side electron shower method rather than a direct electron shower method. In addition, the electron shower treatment is preferably carried out with an electron energy of 10 eV to 100 eV. Further, the processing time of the electron shower treatment is preferably adjusted such that surface resistance of the hole injection layer is increased by not greater than 10% initial surface resistance.

As described above, the electron shower treatment preferably include a blowing treatment carried out in a nitrogen atmosphere, and heating under vacuum or in a nitrogen atmosphere.

Subsequently, a hole transport layer may be selectively stacked on the hole injection layer by vacuum thermal evaporation or spin coating. An emitting layer is stacked on the hole injection layer (without a hole transport layer) or on the hole transport layer (with a hole transport layer). A method of forming the emitting layer is not specifically limited but a variety of techniques including vacuum deposition, inkjet printing, laser sublimation, photolithography, and the like.

Next, an electron transport layer (ETL) (not applicable to a system employing a polymeric emitting layer) and an electron injection layer (EIL) are selectively formed on the emitting layer by vacuum deposition or spin coating, and a metal for a cathode as a second electrode is deposited over the entire surface of the substrate by vacuum thermal evaporation, following by sealing, thereby completing the organic EL device according to the present invention.

Now, the present invention will be described in further detail with reference to Examples. However, it should be understood that the following examples are provided for a better understanding of the present invention and the present invention is by no means restricted to such specific Examples.

EXAMPLE 1

To be used as a substrate and a first electrode, a glass substrate coated with ITO (available from Samsung Corning Co., Ltd.; sheet resistance: 15 $\Omega/cm^2$; coating thickness: 1600 Å) was cut into a size of 50 mm×50 mm×0.7 mm, washed in isopropyl alcohol for 5 minutes and in pure water for 5 minutes by ultrasonic waves, and cleaned with UV/ozone for 30 minutes. Poly(3,4-ethylenedioxythiophene) (PEDOT) (commercially available from Bayer in the trade name of AI4083) was spin coated on the substrate to form a 50 nm thick hole injection layer. After forming the hole injection layer, an electron shower treatment was carried out with an energy of 100 eV, 10 μA for about 10 minutes using an electron shower treatment equipment (manufactured by Korea Vacuum Co., Ltd.) based on a side shower method, followed by performing a blowing treatment in a nitrogen atmosphere for several seconds and a heating treatment at a temperature of about 200° C. in a nitrogen atmosphere.

Next, PFB was spin coated on the hole injection layer to form a 20 nm thick hole transport layer. Then, a polyfluorene-based emitting material TS-9 was spin coated on the hole transport layer to a thickness of 70 to 80 nm to form an emitting layer.

Subsequently, $BaF_2$/Ca were sequentially vacuum deposited on the emitting layer to thicknesses of 5 nm and 3.1 nm, respectively, to form a cathode, thereby completing the organic EL device according to the present invention.

COMPARATIVE EXAMPLE 1

A conventional organic EL device was prepared in the same manner as in Example 1 except that a hole injection layer was not subjected to an electron shower treatment, a blowing treatment, and a heating treatment.

Performance Test

Figure 3:
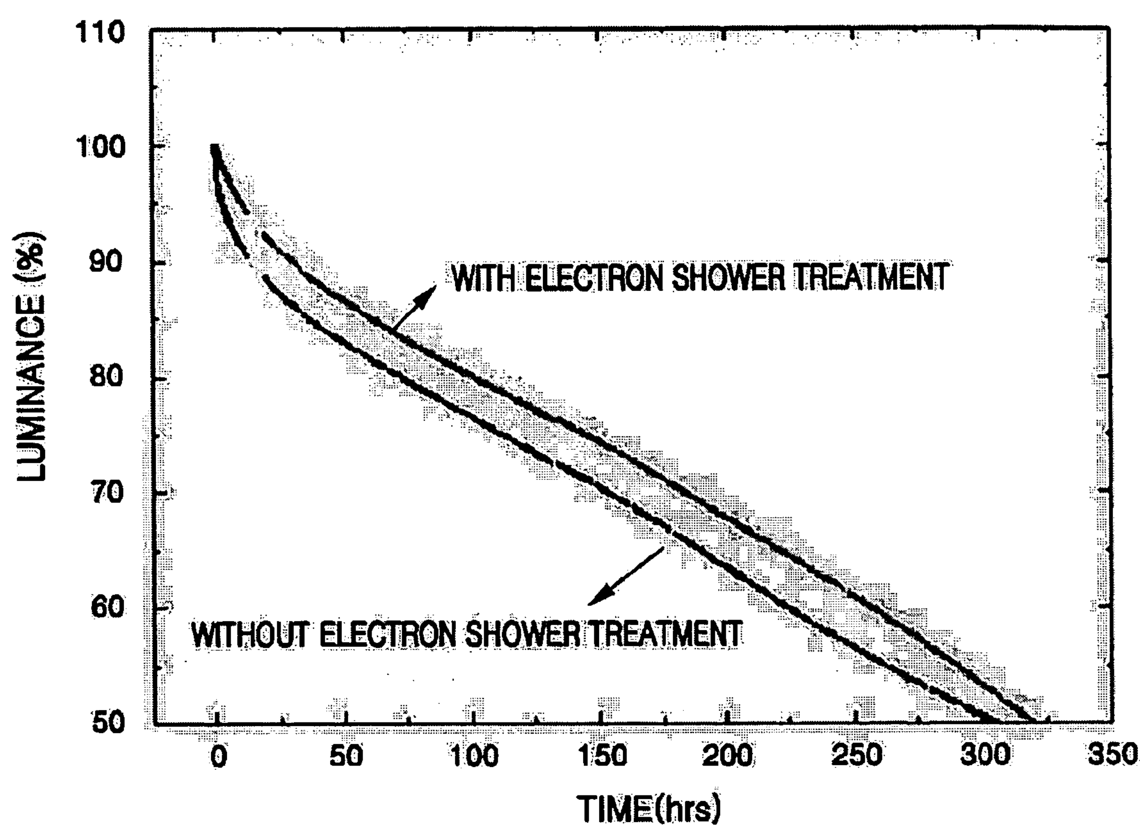
FIG. 3 is a graphical representation illustrating a life versus luminance relationship between the conventional organic EL device and the organic EL device according to an example of the present invention.

As shown in FIG. 3, it is observed that a portion where the luminance rapidly decreases at an initial stage is followed by a portion where the luminance slowly decreases. In the portion where the luminance rapidly decreases at an initial stage of the life curve, there is a definite difference in the luminance between a device with an electron shower treatment and a device without an electron shower treatment. On the other hand, a plateau is observed in the portion where the luminance slowly decreases, which is presumably due to initial removal of electrically unstable impurities remaining on the PEDOT surface as a hole injection layer.

According to the present invention, the hole injection layer was subjected to an electron shower treatment to remove impurities from the hole injection layer and to increase electrical surface resistance, thereby providing an organic EL device having improved performance and service life, and a method for preparing the organic EL device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent device, comprising:

an anode formed on a substrate;

an electron shower treated hole injection layer formed on the anode;

an emitting layer formed on the electron shower treated hole injection layer; and a cathode formed on the emitting layer.

2. The organic electroluminescent device of claim 1, wherein the electron shower treated hole injection layer is produced by carrying out a side electron shower method.

3. The organic electroluminescent device of claim 1, wherein the electron shower treated hole injection layer is produced by an electron shower treatment carried out with an electron energy of 10 eV to 100 eV.

4. The organic electroluminescent device of claim 1, wherein surface resistance of the electron shower treated hole injection layer is not greater than 110% initial surface resistance of a hole injection layer which is not treated with an electron shower.

5. The organic electroluminescent device of claim 1, wherein the electron shower treated hole injection layer is produced by an electron shower treatment with a blowing treatment carried out in a nitrogen atmosphere.

6. The organic electroluminescent device of claim 1, wherein the electron shower treated hole injection layer is produced by an electron shower treatment with heating under vacuum or in a nitrogen atmosphere.

7. The organic electroluminescent device of claim 1, wherein the electron shower treated hole injection layer is made of copper phthalocyanine, starburst-type amines, poly (3,4-ethylenedioxythiophene) (PEDOT), or a mixture thereof.

8. The organic electroluminescent device of claim 1, further comprising an electron transport layer stacked on the emitting layer.

9. The organic electroluminescent device of claim 8, further comprising an electron injection layer stacked on the electron transport layer.

10. The organic electroluminescent device of claim 1, further comprising an electron injection layer stacked on the emitting layer, the electron injection layer (EIL) being one selected from the group consisting of LiF, NaCl, CsF, $Li_2O$, BaO, Liq, and a mixture thereof.

11. A method for preparing an organic electroluminescent device, comprising:

forming an anode on a substrate;

forming a hole injection layer on the anode;

performing an electron shower treatment on the hole injection layer;

forming an emitting layer on the hole injection layer; and forming a cathode on the emitting layer.

12. The method of claim 11, wherein the electron shower treatment is carried out by a side electron shower method.

13. The method of claim 11, wherein the electron shower treatment comprises using an electron gun, and a distance from the electron gun to the hole injection layer ranges from 100 mm to 200 mm.

14. The method of claim 11, wherein the electron shower treatment is carried out with an electron energy of 10 eV to 100 eV.

15. The method of claim 11, wherein a processing time of the electron shower treatment is adjusted such that surface resistance of the hole injection layer is increased by not greater than 10% initial surface resistance.

16. The method of claim 11, wherein the electron shower treatment comprises a blowing treatment carried out in a nitrogen atmosphere.

17. The method of claim 11, wherein the electron shower treatment comprises heating under vacuum or in a nitrogen atmosphere.

18. An organic electroluminescent device produced by the method of claim 11.

19. A method for preparing an organic electroluminescent device, comprising:

forming an anode on a substrate;

forming a hole injection layer on the anode;

removing impurities or unstable ions from the hole injection layer by side electron shower treatment;

forming an emitting layer on the hole injection layer; and forming a cathode on the emitting layer.

* * * * *